United States Patent
Chiang et al.

(10) Patent No.: US 12,027,650 B2
(45) Date of Patent: Jul. 2, 2024

(54) OPTICAL DISPLAY STRUCTURE

(71) Applicants: INTERFACE TECHNOLOGY(CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Che Wen Chiang, Shenzhen (CN); Tsung Yi Su, Shenzhen (CN); Po Lun Chen, Shenzhen (CN)

(73) Assignees: Interface Technology (ChengDu) Co., Ltd., Chengdu (CN); Interface Optoelectronics (Shenzhen) Co., Ltd., Shenzhen (CN); General Interface Solution Limited, Miaoli County (TW)

( * ) Notice: Subject to any disclaimer, the term of this patent is extended or adjusted under 35 U.S.C. 154(b) by 452 days.

(21) Appl. No.: 17/487,265

(22) Filed: Sep. 28, 2021

(65) Prior Publication Data
US 2023/0054796 A1 Feb. 23, 2023

(30) Foreign Application Priority Data
Aug. 19, 2021 (CN) .......................... 202110954607.3

(51) Int. Cl.
*H01L 23/00* (2006.01)
*H01L 27/15* (2006.01)
*H01L 33/44* (2010.01)

(52) U.S. Cl.
CPC ............ *H01L 33/44* (2013.01); *H01L 27/156* (2013.01)

(58) Field of Classification Search
CPC .............................. H01L 33/44; H01L 27/156
See application file for complete search history.

(56) References Cited

FOREIGN PATENT DOCUMENTS

EP 1118902 A1 * 7/2001 ....... G02F 1/133502

* cited by examiner

*Primary Examiner* — Anthony Ho
(74) *Attorney, Agent, or Firm* — Rosenberg, Klein & Lee

(57) ABSTRACT

An optical display structure is provided, including a basing layer, a lighting source layer and a capping layer. The basing layer includes a substrate and at least one trace configuration layer. The lighting source layer is disposed on the basing layer at d emits a plurality of lights for providing a light source. The capping layer is disposed above the lighting source layer to seal the optical display structure. An upper light shielding layer is alternatively disposed on the lighting source layer to shield cross-talk interferences of the emitted lights. A lower light shielding layer is alternatively disposed below the basing layer to shield reflected light from the back side of the substrate. Preferably, both the upper and lower light shielding layers can be disposed at the same time to shield cross-talk interferences and reflected light for providing an optimized inventive effect of the present invention.

23 Claims, 12 Drawing Sheets

OPTICAL DISPLAY STRUCTURE

This application claims priority of Application No. 202110954607.3 filed in Mainland China on 19 Aug. 2021 under 35 U.S.C. § 119; the entire contents of all of which are hereby incorporated by reference.

BACKGROUND OF THE INVENTION

Field of the Invention

The present invention is related to a screen display structure having multiple thin films are stacked therein. More particularly, it is related to an optical display structure in which at least one black matrix is employed to form at least one light shielding layer, so as to improve resolution and perspectivity of the optical display structure.

Description of the Prior Art

In recent years, operational interfaces of informative products have been changed from traditional keyboards or mice to touch panels for inputting signals as the developments of information technologies, wireless communications, and information appliances are rapidly growing and brought into wide applications. And these operational interfaces are usually combined with display elements to form a common panel device. In general, the existing panel devices have been widely utilized in daily work and life and can be used to sense human fingers or other writing tools, such as stylus according to the sensing area provided upon the panel. As we know, a touch panel device can be alternatively fabricated into a resistive type, capacitive type, infrared type, surface acoustic type, and so on according to various mechanisms.

And among them, an electronic display device is an almost omnipresent medium used to convey information to users of various equipment and products. The most commonly used electronic display devices include cathode ray tubes (CRT), plasma display panels (PDP), liquid crystal displays (LCD), electroluminescence displays (EL), light-emitting diode (LED) displays, active matrix organic light-emitting diode (AMOLED) displays, electrophoretic displays (EP), and a variety of displays that may use electromechanical or electro-fluidic light modulation techniques (for example, digital micro-mirror devices, and electrowetting displays), etc. In general, the LED displays are much more is commonly used compared to other displays since they can be easily driven by low-voltage scan and are advantageous of low power consumption, fabrication cost, failure rate, as well as long service life, high luminance, and large visual angle and visual range. However, it is well known that in the existing LED displays, a plurality of thin film stacked structures are usually involved, and different refraction and scattering rate will be provided by different layers of the thin films. As a result, it is apparent that a great amount of considerable stray light will be induced in the stacked thin film structure. Thereby, transparency of the LED display, resolution and contrast of the images to be shown are severely affected.

Please refer to FIG. 1 and FIG. 2, which schematically show simulation light tools of the stray light diagrams from a front side of a conventional LED display. A stray light analysis area is illustrated in FIG. 2 as in the circular area P1. To be more specific, the stray light ray paths are mainly composed of the cross-talk interferences between light-emitting diodes (LEDs) as shown in FIG. 3, the metal mesh reflection as shown in FIG. 4, and the bottom reflection as shown in FIG. 5. It is believed that the LEDs cross-talk interferences in FIG. 3 are usually generated due to large distribution angle of the LEDs. The metal mesh reflection in FIG. 4 is formed when the LED light goes to the top cover glass, be reflected back to the metal mesh, and reflected again to the top cover glass. And, the bottom reflection in FIG. 5 is formed when the LED light goes to the top cover glass, be reflected back to its bottom EVA layer, and reflected again to the top cover glass.

In addition, FIG. 6 and FIG. 7 further provide simulation light tools of the stray light diagrams from a back side of a conventional LED display, in which the average light flux is approximately around 2360 lux and 851 lux, respectively. In detail, the stray light ray paths from the back side of a conventional LED display are mainly composed of the reflection interferences as shown in FIG. 8 and in FIG. 9, wherein the stray light ray path in FIG. 8 is formed when the LED light goes to a top cover glass and is reflected back to its bottom EVA layer. And, the stray light ray path in FIG. 9 is foamed when the LED light goes to a top EVA and is reflected back to its bottom EVA layer. Therefore, in view of these stray light analysis diagrams, it is apparent that the reflection issues exist inevitably in an LED display device since multiple thin film structures are contained in the LED display device, and each thin film structure is characterized by different refraction and scattering rate. These reflections further induce stray light problems, which in turn affects the display effect and image quality of the display device. For instance, image resolution and transparency will be reduced. Also, display effect of the device and observing quality of end users will be dramatically degraded.

Therefore, on account of above, to overcome the above-mentioned problems, it should be obvious that there is indeed an urgent need for the professionals in the field for proposing a new and modified optical display structure to be developed that can effectively solve the above-mentioned problems occurring in the prior design. And by using such novel structure, the long-standing deficiencies of many previous prior arts are effectively avoided so as to implement an optimization result of the present invention. Hereinafter, the detailed specific implementations will be fully described in the following paragraphs.

SUMMARY OF THE INVENTION

In order to overcome the above-mentioned disadvantages, one major objective in accordance with the present invention is provided for a novel optical display structure, which is aimed to modify the current LED thin film display device. Compared to the existing display devices, the proposed optical display structure of the present invention achieves in effectively reducing the conventional stray light issues such that resolution, transparency and contrast rate of the LED thin film display devices are greatly improved. As a result, it is believed that superior visibility and image quality are obtained by employing the proposed invention.

Another objective in accordance with the present invention is provided for an optical display structure in which an upper light shielding layer or a lower light shielding layer is respectively disposed on a front side or on a back side of the LED lighting source layer to shield the stray lights. In addition, both the upper light shielding layer disposed on the front side of the LED lighting source layer and the lower light shielding layer disposed on the back side of the LED lighting source layer can be configured in a preferred embodiment of the present invention for achieving even an optimized inventive effect of the present invention.

In addition, and yet another objective in accordance with the present invention is provided for an optical display structure for panel display devices, in which the foregoing light shielding layer can be formed by employing at least one black matrix. When the upper light shielding layer is disposed on the front side of the LED lighting source layer and the lower light shielding layer is disposed on the back side of the LED lighting source layer, locations of these two light shielding layers can be aligned, or alternatively misaligned. Furthermore, shapes and outlines of the black matrixes can also be designed unrestrictedly, based on different device and product requirements. And owing to the abundant variability, it is believed that the present invention is ensured to meet up with a variety of application requirements and industrial benefits of different end devices, and can be further widely utilized in touch panel products and any related fields.

As a result, for achieving the above-mentioned objectives, the present invention is aimed to provide an optical display structure, which comprises: a basing layer, including a substrate and at least one trace configuration layer; a lighting source layer disposed on the basing layer and emitting a plurality of lights for providing a light source; an upper light shielding layer disposed on the lighting source layer and shielding cross-talk interferences generated between the plurality of lights emitted by the lighting source layer; and a capping layer disposed on the upper light shielding layer for sealing the optical display structure.

According to one embodiment of the present invention, the lighting source layer may include a light-emitting diode (LED) array, which comprises a plurality of light-emitting diodes (LED) for emitting the plurality of lights and providing as the light source.

In one embodiment, the foregoing trace configuration layer of the basing layer can be alternatively disposed on an upper surface of the substrate or on a lower surface of the substrate. In another embodiment, the basing layer may comprise two trace configuration layers, which are the first trace configuration layer and the second trace configuration layer. And, the first trace configuration layer and the second trace configuration layer are respectively disposed on an upper surface of the substrate and on a lower surface of the substrate.

In addition, a bonding layer is further disposed between the upper light shielding layer and the lighting source layer, and the bonding layer includes a thermoplastic layer which is disposed adjacent to the lighting source layer. An optical clear adhesive layer is further connected between the thermoplastic layer and the tipper light shielding layer. On the other hand, the capping layer comprises a cover glass layer and an optical clear adhesive layer is further connected between the cover glass layer and the upper light shielding layer.

According to the embodiment of the present invention, the proposed upper light shielding layer comprises a black matrix structure, which is formed by means of additional adhesive process, yellow light manufacturing process, screen printing process, or ink printing process such that the black matrix structure is formed in the upper light shielding layer. Therefore, since the black matrix structure is advantageous of superior optical absorption characteristics, it achieves in shielding the cross-talk interferences generated between the plurality of lights emitted by the lighting source layer.

Moreover, according to the present invention, a lower light shielding layer can be further disposed below the basing layer to shield at least one reflected light from a back side of the substrate. In a preferred embodiment, the proposed lower light shielding layer may comprise another black matrix structure, which is formed by means of additional adhesive process, yellow light manufacturing process, screen printing process, or ink printing process such that the black matrix structure is is formed in the lower light shielding layer. And therefore, by further employing the optical absorption characteristics of the lower light shielding layer, reflected light from the back side of the substrate can also be shielded and blocked at the same time.

In addition, it is highly emphasized that when both the upper light shielding layer and the lower light shielding layer are disposed in the preferred optical display structure of the present invention, the black matrix structure contained in each light shielding layer is not limited to its shape, layout and/or location configuration. For example, a location of the black matrix structure of the upper light shielding layer and that of the black matrix structure of the lower light shielding layer can be aligned. And yet, alternatively, they can also be misaligned. Therefore, based on the extraordinary variability, it is obvious that the present invention is able to comply with diverse requirements of a great number of various display devices, and applicability of the present invention is believed to be much more improved than ever.

Nevertheless, the present invention is indeed not limited by the foregoing disclosed embodiments as provided above. In another aspect, the optical display structure of the invention may optionally include merely one lower light shielding layer disposed below the basing layer to use the lower light shielding layer for shielding reflected light from the back side of the substrate. In general, it is feasible for those who are skilled in the art to selectively dispose an upper light shielding layer, a lower light shielding layer, or both an upper light shielding layer and a lower light shielding layer, according to their practical requirements based on the technical solutions taught in the present invention without departing from the spirit of the present invention. And as a result, due to the equality, it is claimed that the modifications and/or variations should still fall within the scope of the present invention.

In the following descriptions, these and other objectives of the present invention will become obvious to those of ordinary skill in the art after reading the following detailed description of preferred embodiments.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
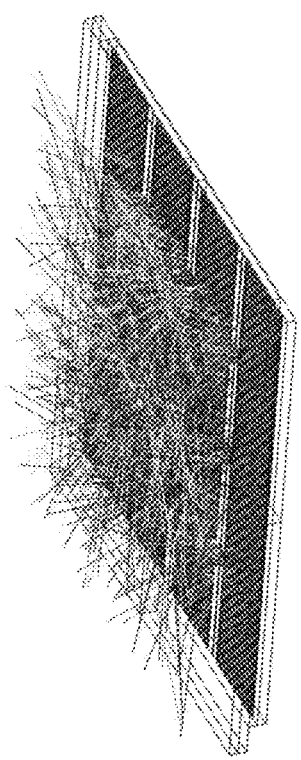
FIG. 1 and FIG. 2 schematically show simulation light tools of the stray light diagrams from a front side of a conventional LED display.
Figure 2:
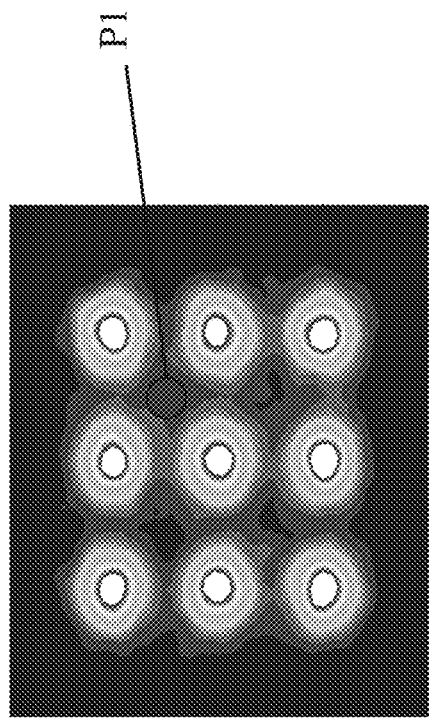

Reference will now be made in detail to the preferred exemplary embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The exemplary embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In the entire specification and claims, unless the contents clearly specify the meaning of sonic terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

Figure 10:
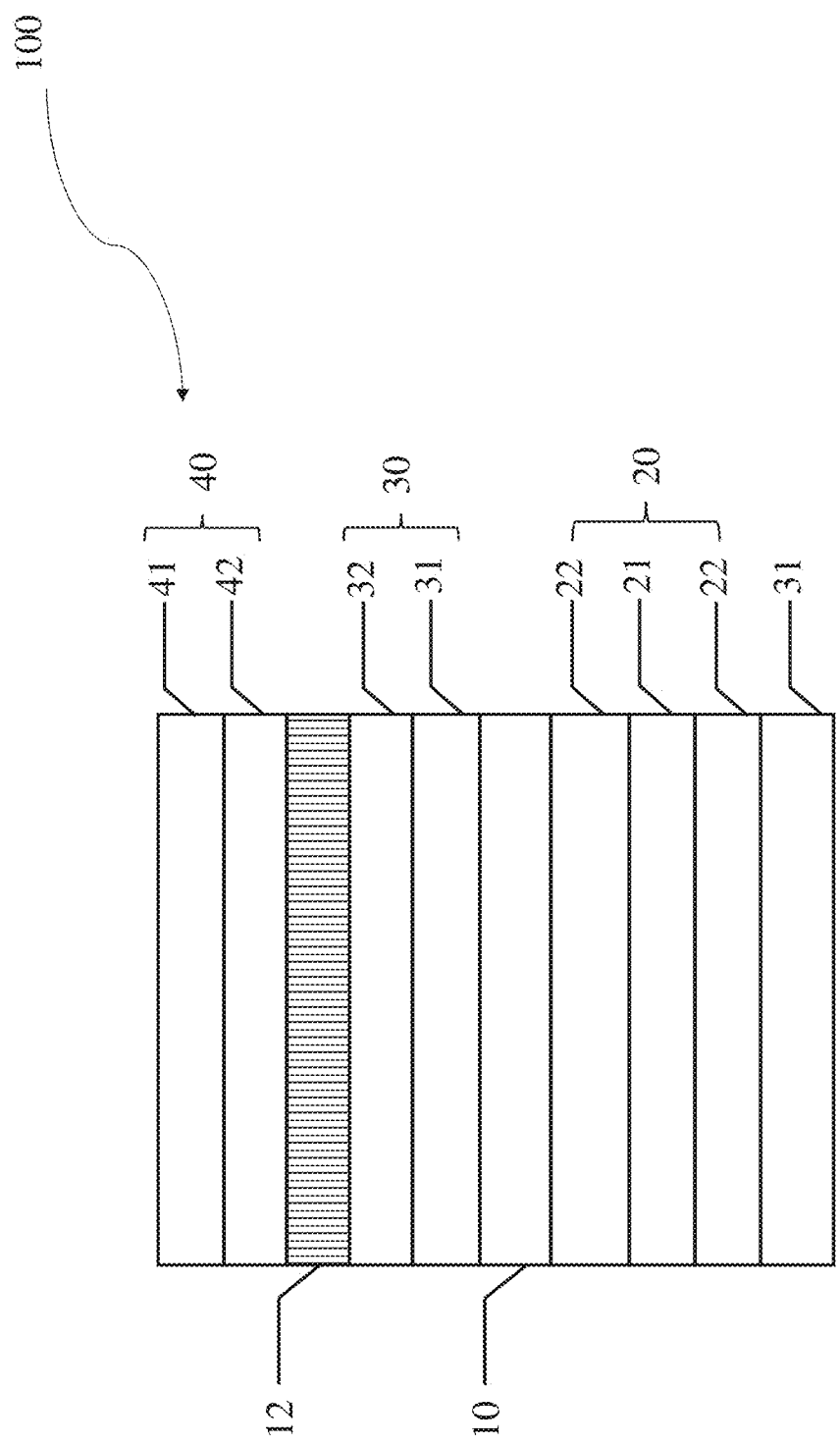
FIG. 10 shows a structural cross-sectional view of an optical display structure in accordance with a first embodiment of the present invention.

As the previous prior arts have mentioned that, the existing LED display devices are mainly composed of multiple thin films and each thin film has different refraction and scattering rate. Therefore, a variety of stray lights reflected from these different thin films will eventually affect the visual effect of a final display image and reduce its resolution, perspectivity, and transparency of the displayed image. As a result, based on the above-mentioned problems to be solved, the present invention is aimed to provide a modified design scheme. Please refer to FIG. 10 firstly, which schematically illustrates a structural cross-sectional view of an optical display structure in accordance with a first embodiment of the present invention. As we can see from FIG. 10, the optical display structure 100 includes a lighting source layer 10. In one embodiment of the present invention, the lighting source layer 10, for example, may include a light-emitting diode (LED) array comprising a plurality of light-emitting diodes (LED) for emitting a plurality of lights and providing as a light source.

The lighting source layer 10 is disposed on a basing layer 20. The basing layer 20 includes a substrate 21 and at least one trace configuration layer 22. According to the embodiment of the present invention, the trace configuration layer 22, for instance, may contain metal meshes formed by at least one metal wire. However, in an alternative embodiment of the present invention, then the trace configuration layer 22 may also be formed by non-metal materials. The present invention is certainly not limited thereto by the configuration of the trace configuration layer 22. Besides, regarding the layout of the trace configuration layer 22, it can be optionally disposed on an upper surface of the substrate 21, or on a lower surface of the substrate 21. In the embodiment as provided in FIG. 10, the applicant of the present invention takes the at least one trace configuration layer 22 of the basing layer 20 comprising a first trace configuration layer and a second trace configuration layer as an illustrative example, in which the first trace configuration layer is disposed on the upper surface of the substrate 21, and the second trace configuration layer is disposed on the lower surface of the substrate 21. Such an illustrative embodiment is aimed to enable those skilled in the art to have a better understanding of the technical contents of the present invention without limiting the scope of the invention. In general, for people who are skilled in the art and having ordinary knowledge in the technical field, it is practicable to arrange the trace configuration layer on their own, according to a variety of device specifications and requirements, and yet the variations should still fall into the claim scope of the present invention within the asserted equality.

An upper light shielding layer 12 is disposed on the lighting source layer 10, and a bonding layer 30 is disposed between the upper light shielding layer 12 and the lighting source layer 10. According to the embodiment of the present invention, the bonding layer 30 comprises a thermoplastic layer 31, which is disposed adjacent to the lighting source layer 10, and an optical clear adhesive (OCA) layer 32 is further connected between the thermoplastic layer 31 and the upper light shielding layer 12. In the embodiment of the present invention, the upper light shielding layer 12 is served to shield cross-talk interferences generated between the plurality of lights emitted by the lighting source layer 10.

According to the exemplary embodiment of the present invention, the material of the substrate 21 for example, can be and yet not limited to, polyester (PET) or colorless polyimide (CPI). And, the bonding layer 30 may take, for example, natural rubber or synthetic rubber, which is made of ethylene vinyl acetate (EVA) copolymer formed by copolymerization of ethylene (E) and vinyl acetate (VA) to form its thermoplastic layer 31. Generally, as we know, the EVA copolymer is characterized by well flexibility and elasticity like rubber, and can still show good flexibility, transparency and surface gloss even at −50° C. In addition, the EVA copolymer has superior chemical stability, anti-aging and ozone resistant properties, and it is non-toxic. Since the EVA copolymer is in a solid state at room temperature and can be melted to flow (in a liquid state) and has a certain viscosity when being heated, it has been widely used as an ideal thermoplastic material in the panel display structure for thermal bonding.

The capping layer 40 is disposed on the upper light shielding layer 12 and includes a cover glass (CG) layer 41. In addition, an optical clear adhesive (OCA) layer 42 is further connected between the cover glass layer 41 and the upper light shielding layer 12, such that the capping layer 40 seals the proposed optical display structure 100.

Figure 3:
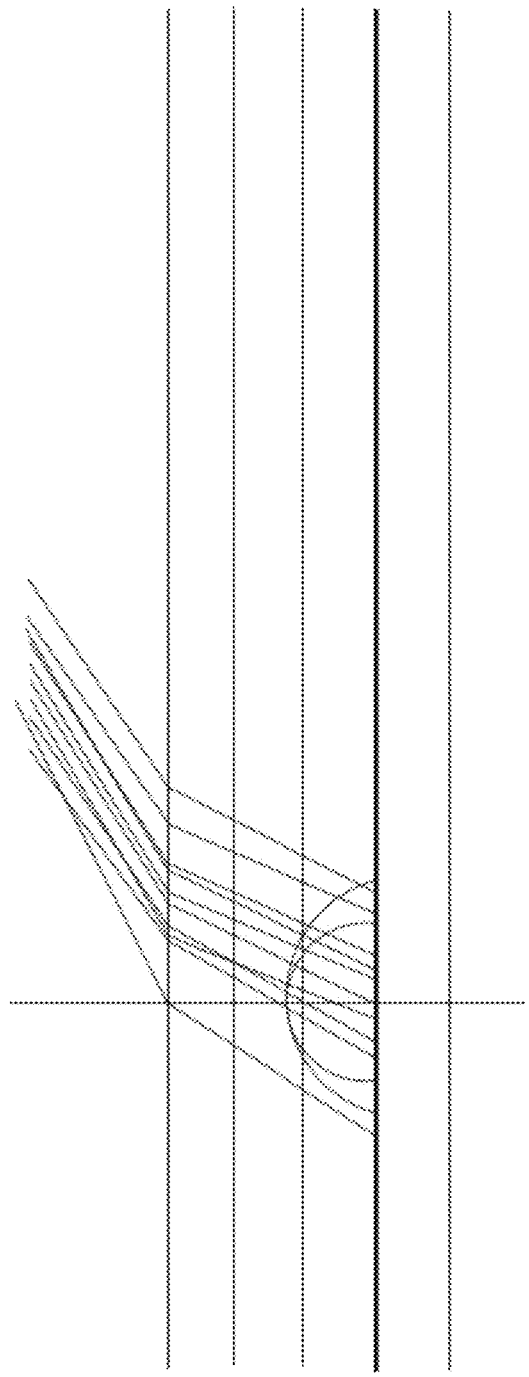
FIG. 3 schematically shows the conventional stray light ray path composed of the cross-talk interferences between light-emitting diodes (LEDs) in prior arts.
Figure 4:
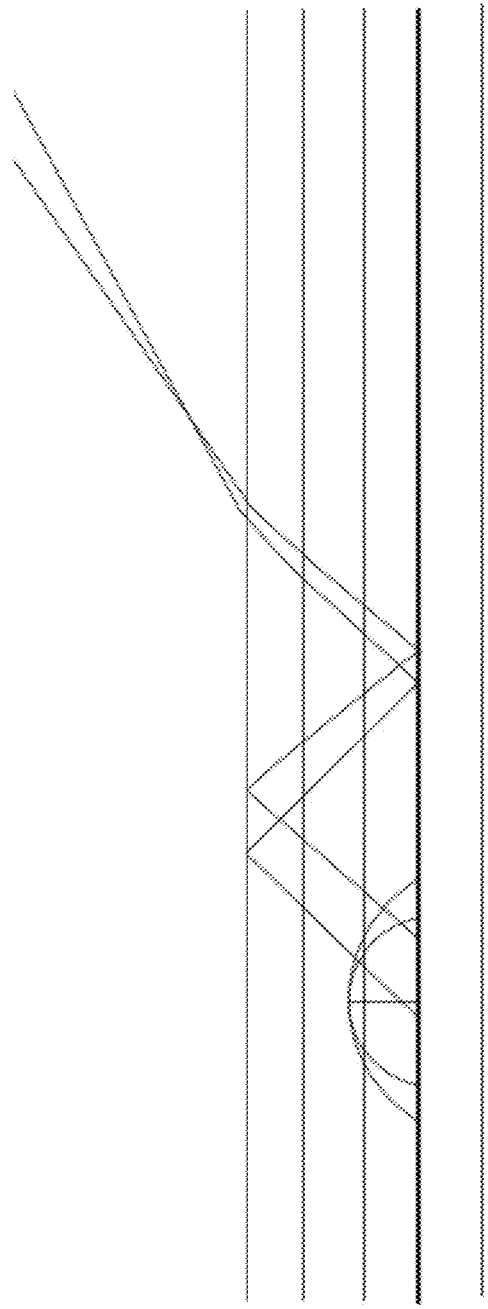
FIG. 4 schematically shows the conventional stray light ray path composed of the metal mesh reflection in prior arts.
Figure 5:
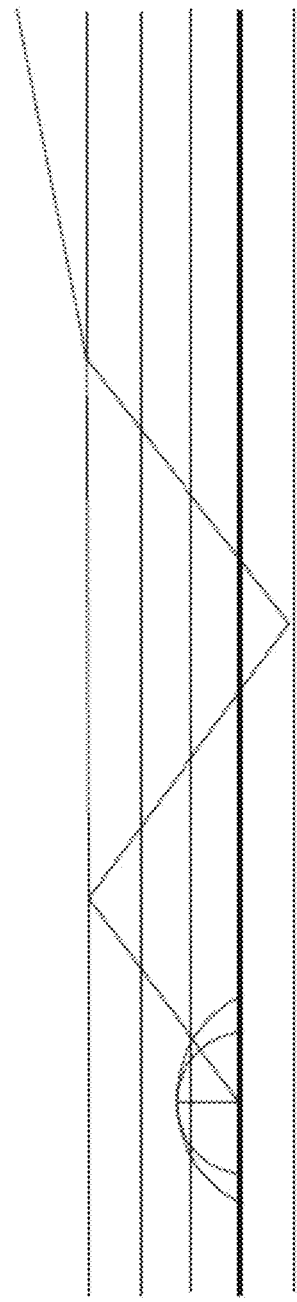
FIG. 5 schematically shows the conventional stray light ray path composed of the bottom reflection in prior arts.
Figure 6:
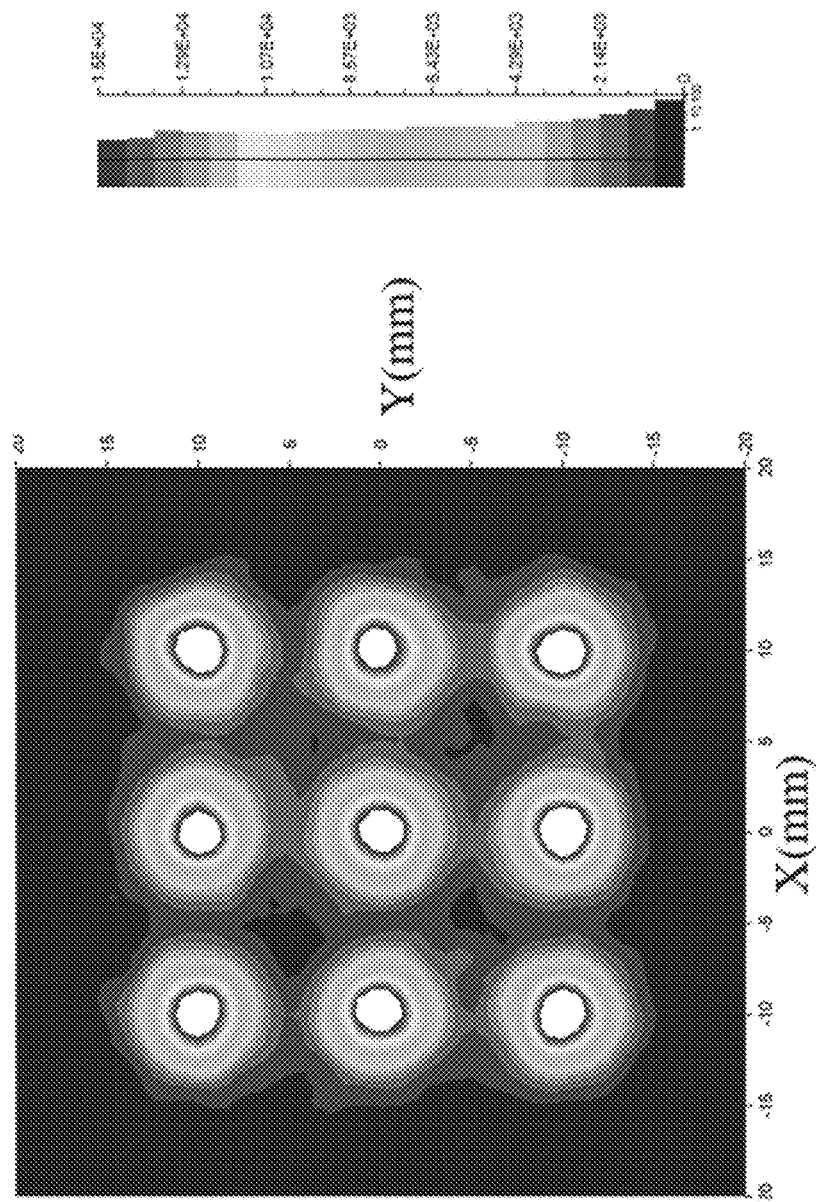
FIG. 6 and FIG. 7 schematically show simulation light tools of the stray light diagrams from a back side of a conventional LED display.
Figure 7:
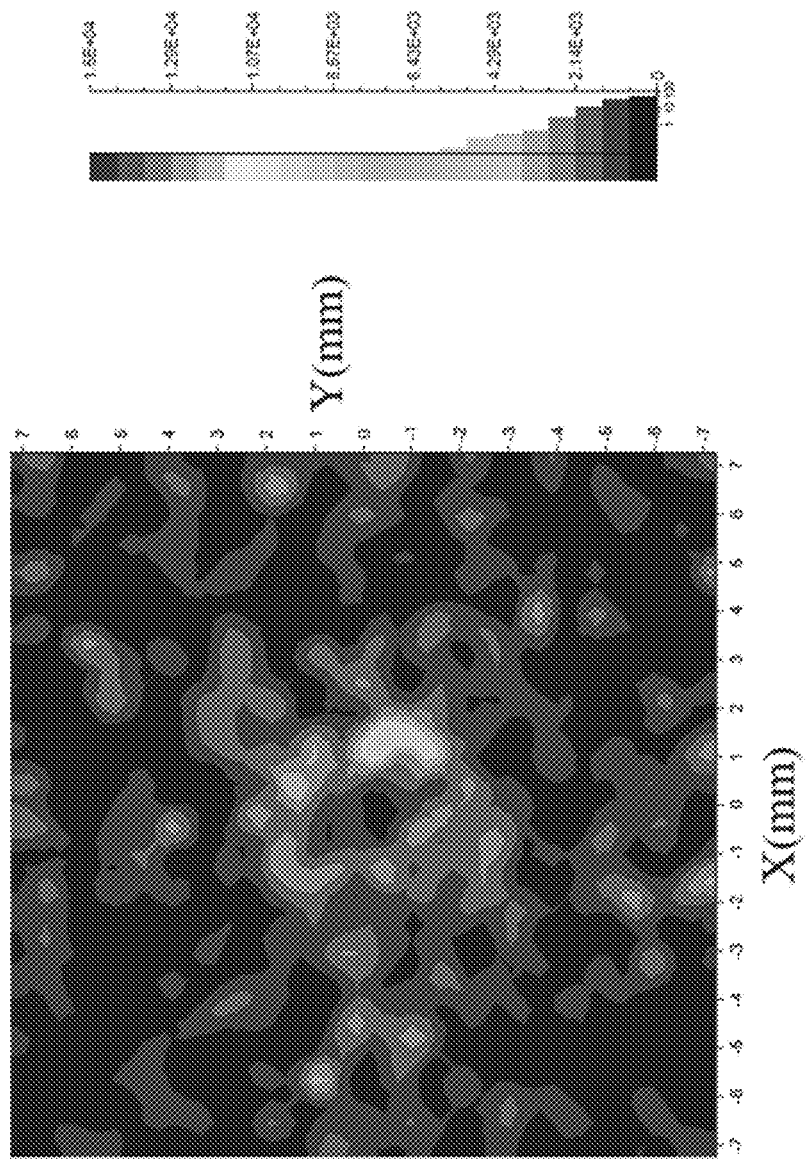
Figure 11:
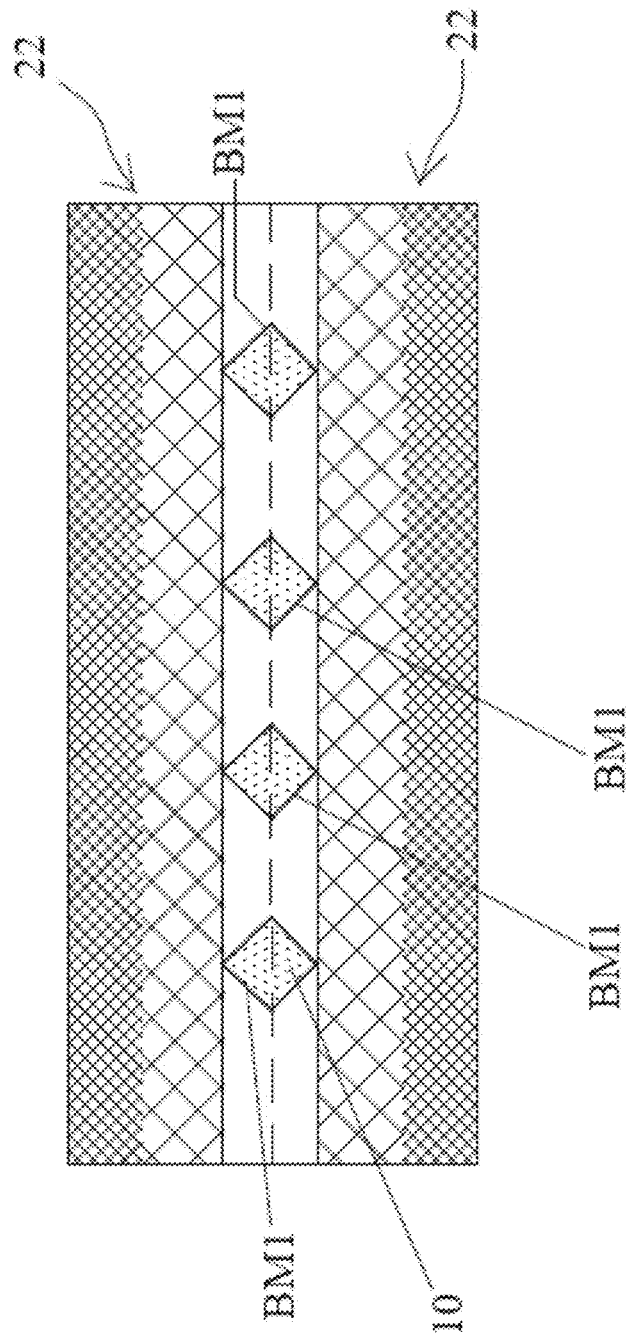
FIG. 11 schematically shows a drawing of the upper light shielding layer of the optical display structure in accordance with the first embodiment of the present invention.

As we have discussed earlier in FIG. 3 to FIG. 5 based on the simulation light tools of stray light paths in the LED thin film display device, since part of the stray light is mainly from the LED cross-talk interferences on the front side of the substrate, the present invention performs to design the upper light shielding layer 12 disposed on the lighting source layer 10 so as to shield the cross-talk interferences generated between the plurality of lights emitted by the lighting source layer 10. Please refer to FIG. 11 at the same time, in which FIG. 11 shows a top view of the upper light shielding layer of the optical display structure in accordance with the embodiment of the present invention. According to the present invention, the upper light shielding layer 12 comprises a black matrix structure BM1, and the black matrix structure BM1, for instance, can be formed by means of additional adhesive process, yellow light manufacturing process, screen printing process, or ink printing process such that the black matrix structure BM1 is formed in the upper light shielding layer 12. In one embodiment among them when the black matrix structure BM1 is formed by an additional adhesive process, its coating material can be, for example, chromium (Cr) or chromium oxide (CrOx). Therefore, the present invention achieves to use the black matrix structure BM1 of the upper light shielding layer 12 to shield the stray light on the front side of the substrate and thus succeeds in enhancing the transparency and perspectivity of the optical display structure of the present invention.

Figure 8:
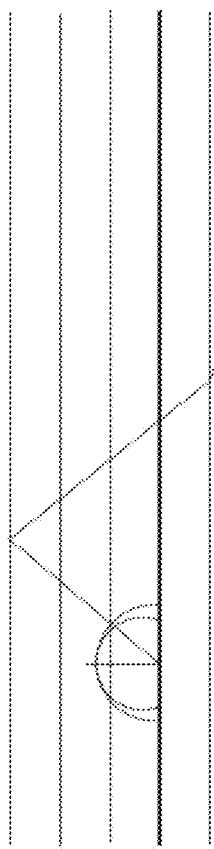
FIG. 8 and FIG. 9 schematically show the conventional stray light ray path composed of reflected lights observed from the back side of a conventional LED display.
Figure 9:
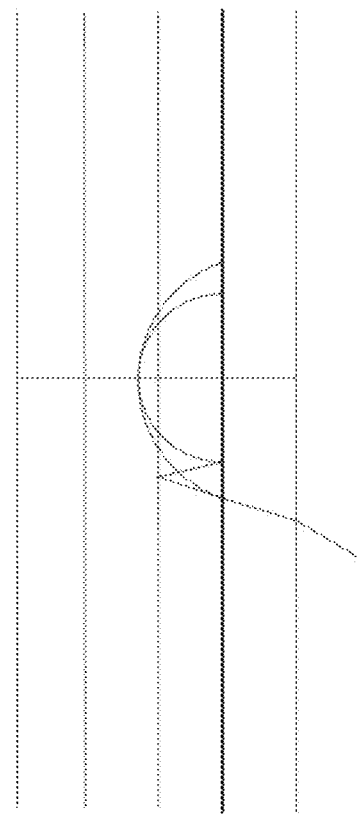
Figure 12:
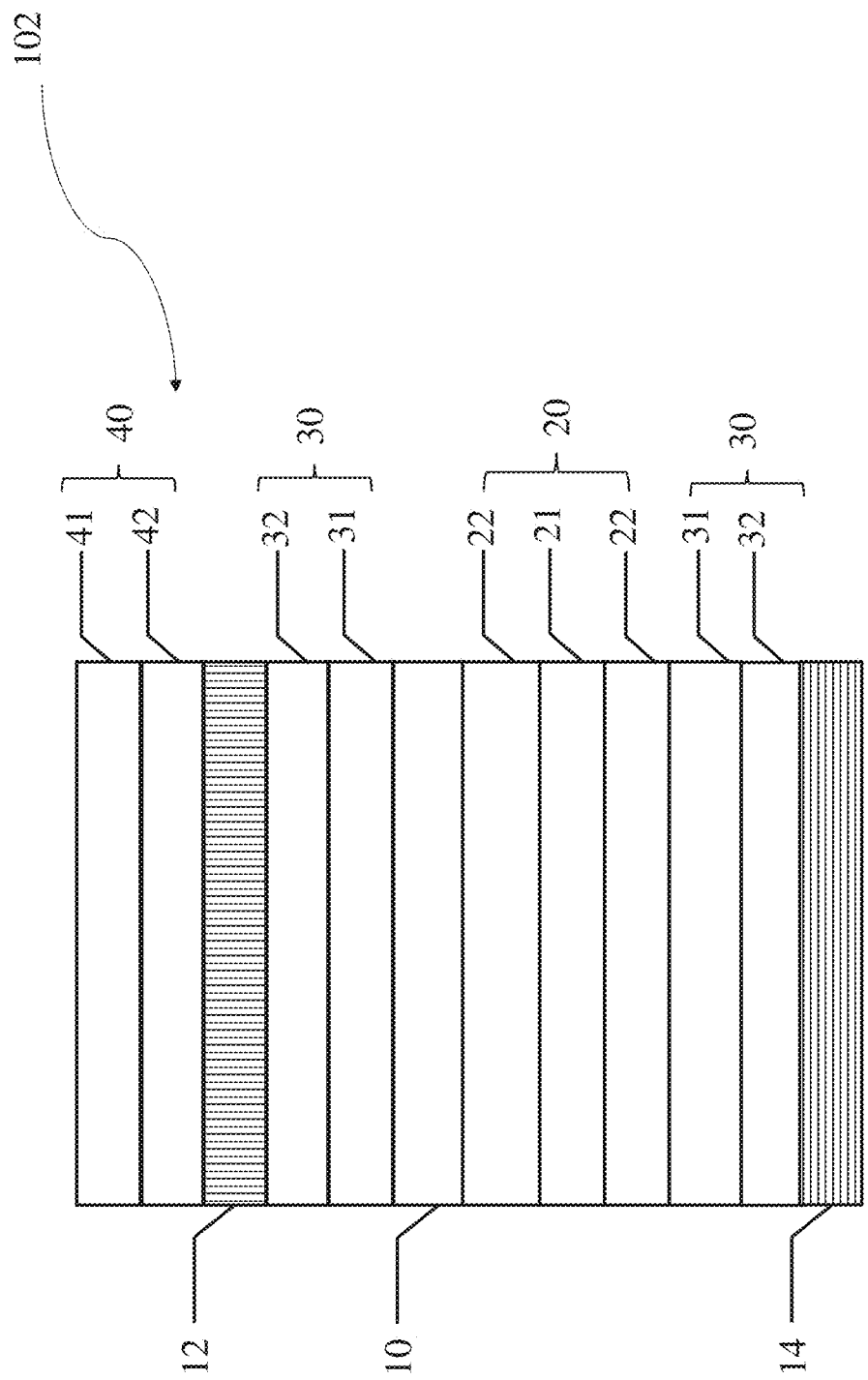
FIG. 12 shows a structural cross-sectional view of an optical display structure in accordance with a second embodiment of the present invention.

And furthermore, as we also have discussed earlier in FIGS. 8 and 9 based on the simulation light tools of stray light paths in the LED thin film display device, since part of the stray light is additionally from the reflection interferences on the back side of the substrate, the present invention also proposes to design a lower light shielding layer disposed below the basing layer to shield at least one reflected light from the back side of the substrate. Please refer to FIG. 12 for a structural cross-sectional view of an optical display structure in accordance with a second embodiment of the present invention. According to the optical display structure 102 of the second embodiment of the present invention, the lower light shielding layer 14 is disposed below the basing layer 20, and a bonding layer 30 is disposed between the lower light shielding layer 14 and the basing layer 20. According to the embodiment, the bonding layer 30 comprises a thermoplastic layer 31 disposed adjacent to the trace configuration layer 22, and an optical clear adhesive (OCA) layer 32 is further connected between the thermoplastic layer 31 and the lower light shielding layer 14. Therefore, by employing the lower light shielding layer 14, the present invention is effective in shielding the reflected light from the back side of the substrate 21.

Figure 13:
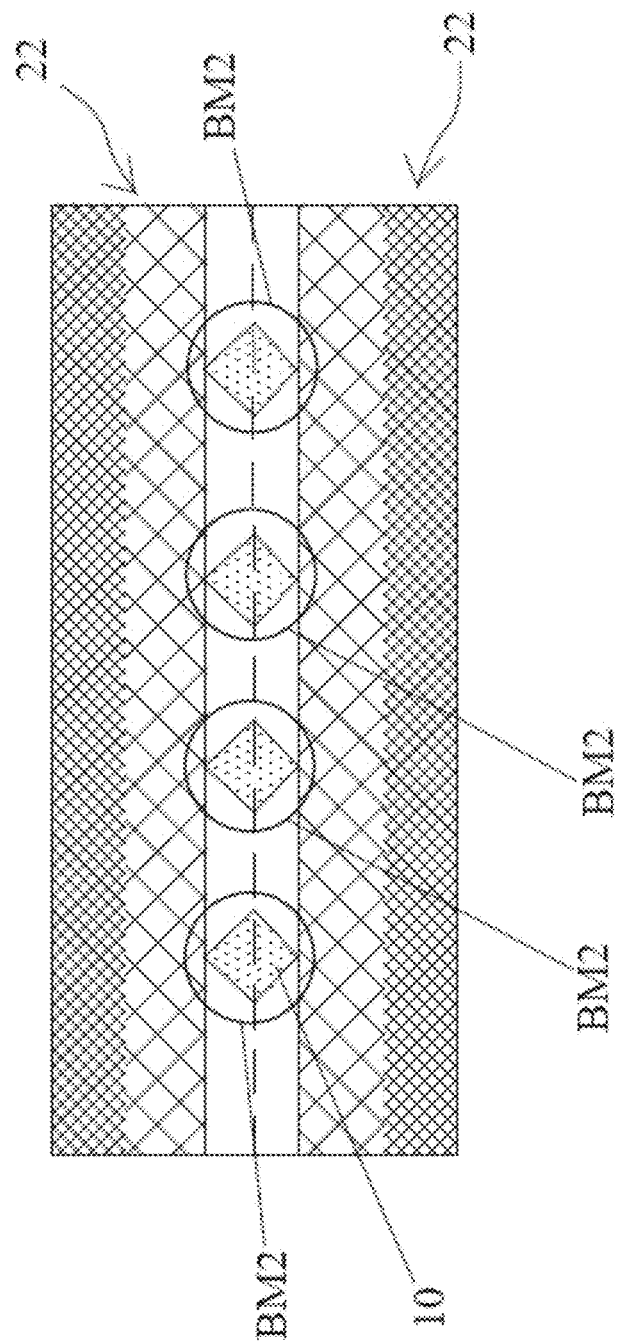
FIG. 13 schematically shows a drawing of the lower light shielding layer of the optical display structure in accordance with the second embodiment of the present invention.

Subsequently, please refer to FIG. 13, which shows a schematical drawing of the lower light shielding layer of the optical display structure in accordance with the second embodiment of the present invention. According to the present invention, the lower light shielding layer 14 comprises a black matrix structure BM2, and the black matrix structure BM2, for instance, can be formed by means of additional adhesive process, yellow light manufacturing process, screen printing process, or ink printing process such that the black matrix structure BM2 is formed in the lower light shielding layer 14. In one embodiment among them when the black matrix structure BM2 is formed by an additional adhesive process, its coating material can be, for example, chromium (Cr) or chromium oxide (CrOx). As a result, it is believed that by employing the black matrix structure BM2 of the lower light shielding layer 14, the stray light reflected from the back side of the substrate can be shielded and eliminated. And thus, the transparency and perspectivity of the disclosed optical display structure of the present invention can be further improved significantly.

It is worth emphasizing that according to the second embodiment of the present invention when the optical display structure 102 includes both the upper light shielding layer 12 disposed on the front side of the substrate 21 and the lower light shielding layer 14 disposed on the back side of the substrate 21, locations of the black matrix structures BM1 and BM2 can be aligned, or alternatively misaligned. Apart from this, shapes, outlines, and physical configurations of the black matrix structures BM1 and BM2 may also differ based on various optical display product needs and/or specifications. Basically, for those who are skilled in the art and having general knowledge backgrounds, appropriate modifications and/or variations with respective to the technical contents disclosed in the present invention without departing from the spirits of the present invention are allowed. However, it is worth noticing that the modifications or variations should still fall info the scope of the present invention. The present invention is certainly not restricted by the certain limited configurations disclosed in the embodiments of the present invention.

Therefore, to sum above, on account of the diversity and variability of the black matrix configurations as described previously, it is apparent that the technical contents disclosed by the present invention can certainly comply with a variety of product application requirements and thus bring impressive industrial benefits to different end devices. Moreover, the present invention can be further widely combined and utilized in touch sensing areas for being applicable to numerous touch panel products and their related fields.

Figure 14:
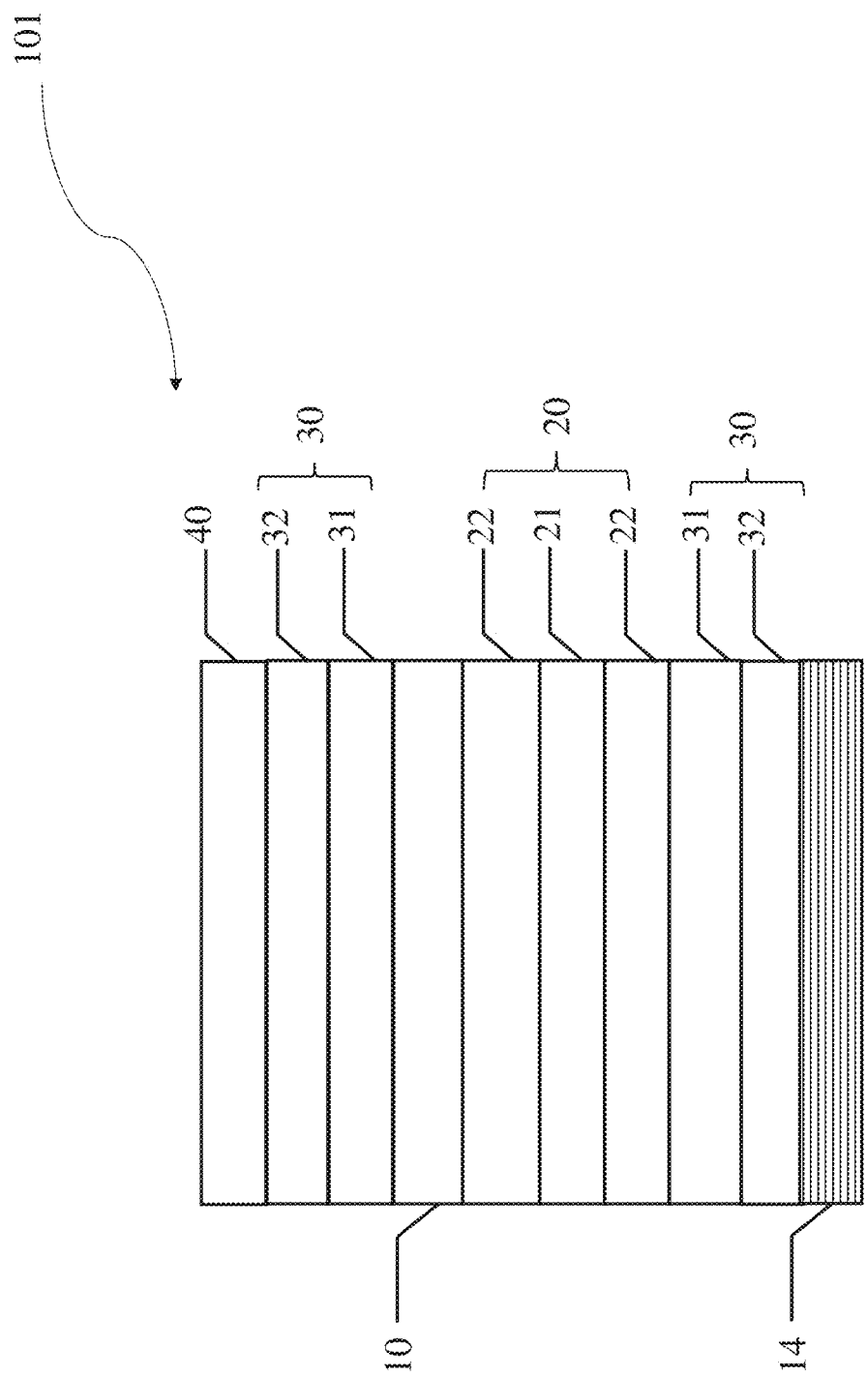
FIG. 14 shows a structural cross-sectional view of an optical display structure in accordance with a third embodiment of the present invention.

And yet, on the other hand, according to the technical solutions as provided earlier in the previous descriptions, it is also feasible to dispose simply one lower light shielding layer 14 on the back side of the substrate. Please find a third embodiment of the present invention as shown in FIG. 14, which shows a structural cross-sectional view of an optical display structure in accordance with the third embodiment of the present invention. As illustrated in FIG. 14, the optical display structure 101 includes a lighting source layer 10, a basing layer 20, a capping layer 40, two bonding layers 30 and a lower light shielding layer 14. The bonding layer 30 which is disposed below the basing layer 20 includes a thermoplastic layer 31 adjacent to the trace configuration layer 22, and an optical clear adhesive (OCA) layer 32 is further connected between the thermoplastic layer 31 and the lower light shielding layer 14. According to the embodiment, characteristics and properties of the lower light shielding layer 14 are illustrated as we have discussed in FIG. 13, which comprises the black matrix structure BM2, and the black matrix structure BM2, for instance, can be formed by means of additional adhesive process, yellow light manufacturing process, screen printing process, or ink printing process such that the black matrix structure BM2 is formed in the lower light shielding layer 14. As a result, when the plurality of lights from the lighting source layer 10 emit to the capping layer 40 and are reflected back to the basing layer 20, the proposed lower light shielding layer 14 effectively shields the reflected light from the back side of the substrate 21. And thus, it is believed and guaranteed that by employing the black matrix structure BM2 of the lower light shielding layer 14, the stray light reflected from the back side of the substrate can be significantly suppressed and shielded.

As a result, according to the proposed technical contents provided by the present invention, it is apparent that the main techniques of the present invention include disposing a light shielding layer on the front side or on the back side of the substrate. Among them, the light shielding layer disposed on the front side of the substrate is used to shield cross-talk interferences generated between the lights, and the light shielding layer disposed on the back side of the substrate is used to shield reflected light from the back side of the substrate. Preferably, in order to enhance the inventive effect of the present invention, the optical display structure in an optimized embodiment of the invention may include both an upper light shielding layer on the front side of the substrate and a lower light shielding layer on the back side of the substrate for shielding both the cross-talk interferences and the reflected light. Therefore, it is believed that resolution, perspectivity, and contrast rate of the image shown can be greatly improved. Moreover, in such a preferred embodiment when both light shielding layers are disposed, their black matrix structures are not limited to individual exterior outlines, shapes, and relative locations. As such, requirements and diversities of different display product can be conformed, and the applicability of the present invention is thus widely improved and is able to meet up with a variety of market demands.

Therefore, based on at least one embodiment provided above, it is believed that, when compared to the prior arts, it is obvious that the optical display structure disclosed by the present invention is effective in solving the existing problems occurring in the prior arts. According to the proposed technical solutions in the present invention, it is believed that a LED display structure can be improved to show a much better transparency and image quality than ever. It is still worth emphasizing that overall, it is believed that for people who are skilled in the art and having understandings and technical backgrounds to the present invention, it would be allowed for them to make various modifications or changes depending on different device requirements and/or specifications without departing from the scope of the invention. The several illustrative embodiments described in the foregoing paragraphs are intended to explain the main technical features of the present invention so that those skilled in the art are able to fully understand and accordingly make implementations. However, the present invention is certainly not limited thereto.

And yet furthermore, according to the optical display structure disclosed in the present invention, it can also be further applied to display devices that are not limited to use LED as its lighting source. The present invention can be applied in a variety of technical fields other than the light-emitting diodes. The present invention is not specifically limited to a LED technical filed. As a result, it is obvious that the present invention apparently shows much more effective performances than before. In addition, it is believed that the present invention is instinct, effective and highly competitive for technologies and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An optical display structure, comprising:
   a basing layer, including a substrate and at least one trace configuration layer;
   a lighting source layer, disposed on the basing layer and emitting a plurality of lights for providing a light source;
   an upper light shielding layer, disposed on the lighting source layer and shielding cross-talk interferences generated between the plurality of lights emitted by the lighting source layer;
   a lower light shielding layer, which is disposed below the basing layer to shield at least one reflected light from a back side of the substrate, wherein the lower light shielding layer comprises a black matrix structure, which is formed by means of additional adhesive process, yellow light manufacturing process, screen printing process, or ink printing process such that the black matrix structure is formed in the lower light shielding layer; and
   a capping layer, disposed on the upper light shielding layer for sealing the optical display structure.

2. The optical display structure according to claim 1, wherein the at least one trace configuration layer of the basing layer is alternatively disposed on an upper surface of the substrate or on a lower surface of the substrate.

3. The optical display structure according to claim 1, wherein the at least one trace configuration layer of the basing layer comprises a first trace configuration layer and a second trace configuration layer, which are respectively disposed on an upper surface of the substrate and on a lower surface of the substrate.

4. The optical display structure according to claim 1, further comprising a bonding layer, which is disposed between the upper light shielding layer and the lighting source layer.

5. The optical display structure according to claim 4, wherein the bonding layer comprises a thermoplastic layer disposed adjacent to the lighting source layer, and an optical clear adhesive layer is further connected between the thermoplastic layer and the upper light shielding layer.

6. The optical display structure according to claim 1, wherein the capping layer comprises a cover glass layer and an optical clear adhesive layer is further connected between the cover glass layer and the upper light shielding layer.

7. The optical display structure according to claim 1, wherein the upper light shielding layer comprises a black matrix structure, which is formed by means of additional adhesive process, yellow light manufacturing process, screen printing process, or ink printing process such that the black matrix structure is formed in the upper light shielding layer.

8. The optical display structure according to claim 1, further comprising a bonding layer which is disposed between the lower light shielding layer and the basing layer.

9. The optical display structure according to claim 8, wherein the bonding layer comprises a thermoplastic layer disposed adjacent to the at least one trace configuration layer, and an optical clear adhesive layer is further connected between the thermoplastic layer and the lower light shielding layer.

10. The optical display structure according to claim 1, wherein each of the upper light shielding layer and the lower light shielding layer comprises a black matrix structure, and a location of the black matrix structure of the upper light shielding layer and that of the black matrix structure of the lower light shielding layer are alternatively aligned or misaligned.

11. The optical display structure according to claim 1, wherein the lighting source layer includes a light-emitting diode (LED) array comprising a plurality of light-emitting diodes (LED) for emitting the plurality of lights and providing as the light source.

12. An optical display structure, comprising:
 a basing layer, including a substrate and at least one trace configuration layer;
 a lighting source layer, disposed on the basing layer and emitting a plurality of lights for providing a light source;
 a capping layer, disposed on the lighting source layer for sealing the optical display structure; and
 a lower light shielding layer, disposed below the basing layer, such that when the plurality of lights from the lighting source layer emit to the capping layer and are reflected to the basing layer, the lower light shielding layer shields at least one reflected light from a back side of the substrate, wherein the lower light shielding layer comprises a black matrix structure, which is formed by means of additional adhesive process, yellow light manufacturing process, screen printing process, or ink printing process such that the black matrix structure is formed in the lower light shielding layer.

13. The optical display structure according to claim 12, wherein the at least one trace configuration layer of the basing layer is alternatively disposed on an upper surface of the substrate or on a lower surface of the substrate.

14. The optical display structure according to claim 12, wherein the at least one trace configuration layer of the basing layer comprises a first trace configuration layer and a second trace configuration layer, which are respectively disposed on an upper surface of the substrate and on a lower surface of the substrate.

15. The optical display structure according to claim 12, further comprising a bonding layer, which is disposed between the lower light shielding layer and the basing layer.

16. The optical display structure according to claim 15, wherein the bonding layer comprises a thermoplastic layer disposed adjacent to the at least one trace configuration layer, and an optical clear adhesive layer is further connected between the thermoplastic layer and the lower light shielding layer.

17. The optical display structure according to claim 12, further comprising an upper light shielding layer which is disposed between the lighting source layer and the capping layer, such that the upper light shielding layer shields cross-talk interferences generated between the plurality of lights emitted by the lighting source layer.

18. The optical display structure according to claim 17, further comprising a bonding layer, which is disposed between the upper light shielding layer and the lighting source layer.

19. The optical display structure according to claim 18, wherein the bonding layer comprises a thermoplastic layer disposed adjacent to the lighting source layer, and an optical clear adhesive layer is further connected between the thermoplastic layer and the upper light shielding layer.

20. The optical display structure according to claim 17, wherein the capping layer comprise a cover glass layer and an optical clear adhesive layer is further connected between the cover glass layer and the upper light shielding layer.

21. The optical display structure according to claim 17, wherein the upper light shielding layer comprises a black matrix structure, which is formed by means of additional adhesive process, yellow light manufacturing process, screen printing process, or ink printing process such that the black matrix structure is formed in the upper light shielding layer.

22. The optical display structure according to claim 17, wherein each of the upper light shielding layer and the lower light shielding layer comprises a black matrix structure, and a location of the black matrix structure of the upper light shielding layer and that of the black matrix structure of the lower light shielding layer are alternatively aligned or misaligned.

23. The optical display structure according to claim 12, wherein the lighting source layer includes a light-emitting diode (LED) array comprising a plurality of light-emitting diodes (LED) for emitting the plurality of lights and providing as the light source.

\* \* \* \* \*